United States Patent
Mandal et al.

(10) Patent No.: US 6,171,945 B1
(45) Date of Patent: Jan. 9, 2001

(54) CVD NANOPOROUS SILICA LOW DIELECTRIC CONSTANT FILMS

(75) Inventors: Robert P. Mandal, Saratoga; David Cheung, Foster City; Wai-Fan Yau, Mountain View, all of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/177,044

(22) Filed: Oct. 22, 1998

(51) Int. Cl.$^7$ .................................................. H01L 21/31
(52) U.S. Cl. .................. 438/622; 438/623; 438/624; 438/787; 438/790
(58) Field of Search .............................. 438/787, 790, 438/624, 622, 623

(56) References Cited

U.S. PATENT DOCUMENTS

| | | | |
|---|---|---|---|
| 4,812,325 | 3/1989 | Ishihara et al. | 427/69 |
| 4,845,054 | 7/1989 | Mitchener | 437/238 |

(List continued on next page.)

FOREIGN PATENT DOCUMENTS

| | | |
|---|---|---|
| 0 884 401 A1 | 12/1998 | (EP) . |
| 59-98726 | 11/1982 | (JP) . |
| 06163521A2 | 6/1994 | (JP) . |
| 06168937 | 6/1994 | (JP) . |
| 08222559 A2 | 8/1996 | (JP) . |
| 08236518 A2 | 9/1996 | (JP) . |
| 08288286 A2 | 11/1996 | (JP) . |
| WO 94/01885 | 1/1994 | (WO) . |
| WO 97/11488 | 3/1997 | (WO) . |

OTHER PUBLICATIONS

M. Matsuura, Y. Hayshide, H. Kotani, T. Nishimura, H. Iuchi, C.D. Dobson, A. Kiermasz, K. Beekmann and R. Wilby, Novel Self–planarizing CVD Oxide for Interlayer Dielectric Applications, ©1994 IEEE, IEDEM 94–117–120–IEDM 94.

A, Klumpp and H. Sigmund, "Photoinduced Transformation of Polysilxanen Layers to $Sio_2$", vol. 43 (1989) pp. 301–303.

PCT International Search Report for PCT/US24918

Frédéric Gaillard, PAscal Brault$^{a)}$, Peirre Brouquet, "Silicon dioxide chemical vapor deposition using silane and hydrogen peroxide." Rapid Communications, J. Vac. Sci. Technol. B 14(4), Jul./Aug. 1996, ©1996 American Vacuum Society, pp. 2767–2769.

(List continued on next page.)

* cited by examiner

Primary Examiner—Charles Bowers
Assistant Examiner—Lisa Kilday
(74) Attorney, Agent, or Firm—Thomason, Moser & Patterson

(57) ABSTRACT

A method and apparatus for depositing nano-porous low dielectric constant films by reaction of a silicon hydride containing compound or mixture optionally having thermally labile organic groups with a peroxide compound on the surface of a substrate. The deposited silicon oxide based film is annealed to form dispersed microscopic voids that remain in a nano-porous silicon oxide based film having a foam structure. The nano-porous silicon oxide based films are useful for filling gaps between metal lines with or without liner or cap layers. The nano-porous silicon oxide based films may also be used as an intermetal dielectric layer for fabricating dual damascene structures. Preferred nano-porous silicon oxide based films are produced by reaction of 1,3,5-trisilanacyclohexane, bis(formyloxysilano)methane, or bis(glyoxylylsilano)methane and hydrogen peroxide followed by a cure/anneal that includes a gradual increase in temperature.

43 Claims, 9 Drawing Sheets

U.S. PATENT DOCUMENTS

| | | | |
|---|---|---|---|
| 4,894,352 | 1/1990 | Lane et al. | 437/238 |
| 4,900,591 | 2/1990 | Bennett et al. | 427/255 |
| 5,028,566 | 7/1991 | Lagendijk | 437/238 |
| 5,120,680 | 6/1992 | Foo et al. | 437/238 |
| 5,124,014 | 6/1992 | Foo et al. | 204/192.32 |
| 5,314,724 | 5/1994 | Tsukune et al. | 427/489 |
| 5,360,646 * | 11/1994 | Morita | 427/574 |
| 5,470,801 | 11/1995 | Kapoor et al. | 437/238 |
| 5,638,251 | 6/1997 | Goel et al. | 361/313 |
| 5,703,404 | 12/1997 | Matsuura | 257/758 |
| 5,804,508 * | 9/1998 | Gnade | 438/778 |
| 5,849,644 * | 12/1998 | Schuegraf | 438/790 |
| 5,918,146 * | 2/2000 | Yamashita | 438/631 |
| 5,981,373 * | 11/1999 | Sunada | 438/624 |
| 5,985,770 * | 11/1999 | Sandhu | 438/787 |
| 6,001,747 * | 12/1999 | Annapragada | 438/790 |
| 6,022,812 * | 2/2000 | Smith | 438/761 |

OTHER PUBLICATIONS

K. H. A. Bogart and N. F. Dalleska, G. R. Bogart, Ellen R. Fisher, "Plasma enhanced chemical vapor deposition of $Sio_2$ using novel alkoxysilane precursors," Rapid Communications, J. Vac. Sci. Technol. A 13(2), Mar./Apr. 1995, ©1995 American Vacuum Society, pp. 476–480.

C. D. Dobson, A. Kiermasz, K. Beekman, r. J. Wilby, "Advanced $SiO_2$, Planarization Using Silane and $H_2$ $O_2$." Semiconductor International 85, Dec. 1994, 3 pages.

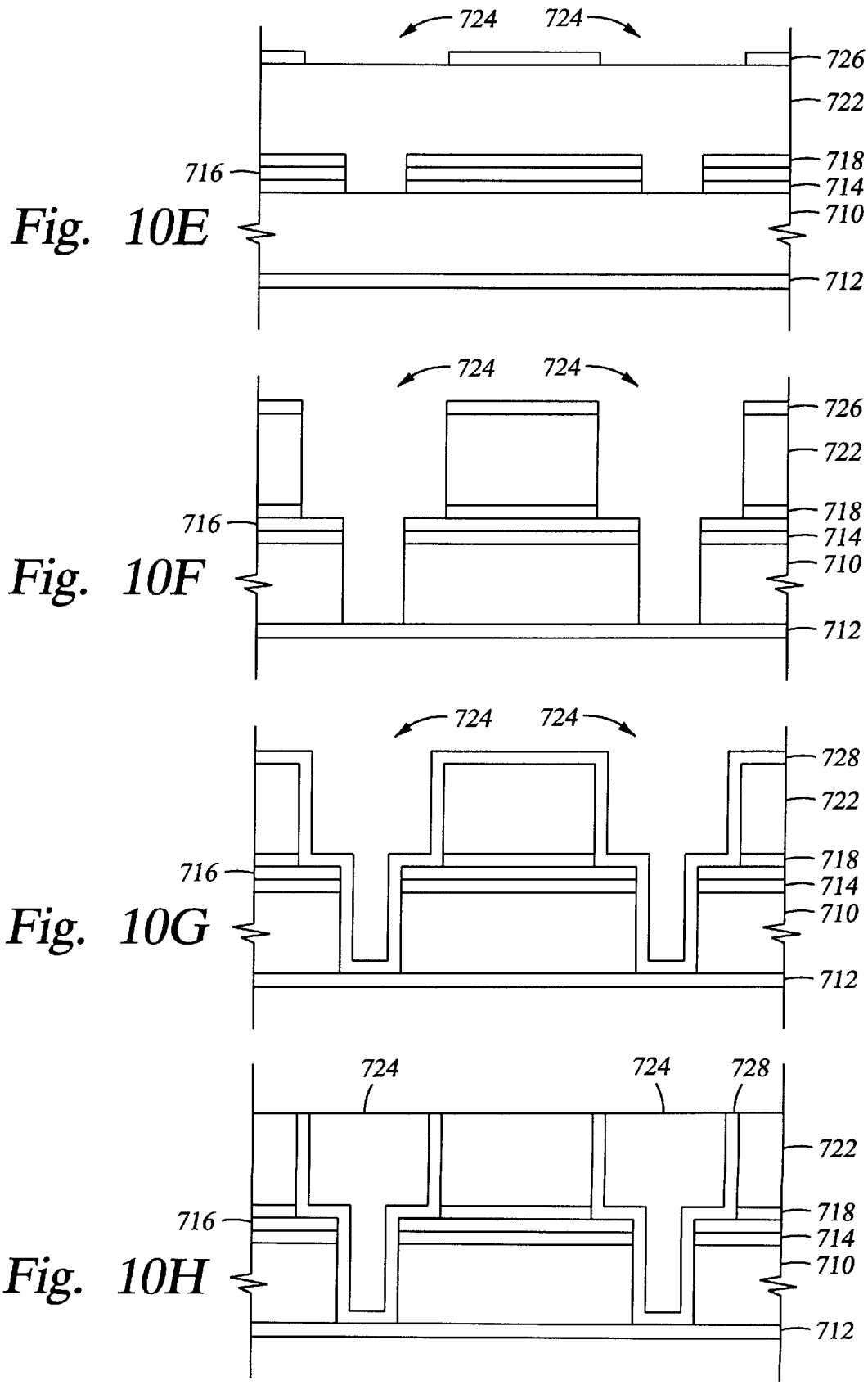

CVD NANOPOROUS SILICA LOW DIELECTRIC CONSTANT FILMS

BACKGROUND OF THE DISCLOSURE

1. Field of the Invention

The present invention relates to the fabrication of integrated circuits. More particularly, the invention relates to a process and apparatus for depositing dielectric layers on a substrate.

2. Background of the Invention

One of the primary steps in the fabrication of modern semiconductor devices is the formation of metal and dielectric films on a substrate by chemical reaction of gases. Such deposition processes are referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed on the substrate. A preferred method of depositing metal and dielectric films at relatively low temperatures is plasma-enhanced CVD (PECVD) techniques such as described in U.S. Pat. No. 5,362,526, entitled "Plasma-Enhanced CVD Process Using TEOS for Depositing Silicon Oxide", which is incorporated by reference herein. Plasma-enhanced CVD techniques promote excitation and/or disassociation of the reactant gases by the application of radio frequency (RF) energy to a reaction zone near the substrate surface, thereby creating a plasma of highly reactive species. The high reactivity of the released species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 $\mu$m and even 0.25 $\mu$m feature sizes, and tomorrow's plants soon will be producing devices having even smaller geometries.

In order to further reduce the size of devices on integrated circuits, it has become necessary to use conductive materials having low resistivity and insulators having low k (dielectric constant<4.0) to reduce the capacitive coupling between adjacent metal lines. Liner/barrier layers have been used between the conductive materials and the insulators to prevent diffusion of byproducts such as moisture onto the conductive material as described in International Publication Number WO 94/01885. For example, moisture that can be generated during formation of a low k insulator readily diffuses to the surface of the conductive metal and increases the resistivity of the conductive metal surface. A barrier/liner layer formed from conventional silicon oxide or silicon nitride materials can block the diffusion of the byproducts. However, the barrier/liner layers typically have dielectric constants that are significantly greater than 4.0, and the high dielectric constants result in a combined insulator that may not significantly reduce the dielectric constant.

FIG. 1A illustrates a PECVD process for depositing a barrier/liner layer as described in International Publication Number WO 94/01885. The PECVD process deposits a multi-component dielectric layer wherein a silicon dioxide ($SiO_2$) liner layer 2 is first deposited on a patterned metal layer having metal lines 3 formed on a substrate 4. The liner layer 2 is deposited by a plasma enhanced reaction of silane ($SiH_4$) and nitrous oxide ($N_2O$) at 300° C. A self-planarizing low k dielectric layer 5 is then deposited on the liner layer 2 by thermal reaction of a silane compound and a peroxide compound at a temperature below 200° C. The self-planarizing layer 5 retains moisture that is removed by annealing. The liner layer 2 is an oxidized silane film that has effective barrier properties when deposited in a manner which provides a dielectric constant of at least 4.5. The dielectric constant of the oxidized silane film can be decreased to about 4.1 by altering process conditions in a manner that decreases moisture barrier properties of the film. Conventional liner layers, such as SiN, have even higher dielectric constants, and the combination of low k dielectric layers with high k dielectric liner layers provides little or no improvement in the overall stack dielectric constant and capacitive coupling.

As shown in FIG. 1B, WO 94/01885 further describes an optional $SiO_2$ cap layer 6 that is deposited on the low k dielectric layer 5 by the reaction of silane and $N_2O$. The cap layer 6 is also an oxidized silane film that has good barrier properties when deposited in a manner that provides a dielectric constant of about 4.5. Both the liner layer 2 and the cap layer 6 have a dielectric constant greater than 4.5 and the high dielectric constant layers substantially detract from the benefit of the low k dielectric layer 5.

As devices get smaller, liner layers and cap layers having high dielectric constants contribute more to the overall dielectric constant of a multi-component dielectric layer. Furthermore, known low k dielectric materials generally have low oxide content which makes the material inadequate as an etch stop layer during etching of vias and/or interconnects. Silicon nitride has been the etch stop material of choice for making interconnect lines in low k dielectric materials. However, the silicon nitride has a relatively high dielectric constant (dielectric constant of about 7) compared to the surrounding low k dielectric layers. It has also been discovered that the silicon nitride may significantly increase the capacitive coupling between interconnect lines, even when an otherwise low k dielectric material is used as the primary insulator. This may lead to crosstalk and/or resistance-capacitance (RC) delay that degrades the overall performance of the device. Thus, the silicon nitride etch stop layers are typically removed after etching of the underlying dielectric layers.

Ideally, a low k dielectric layer having both good barrier properties for use as a liner layer and sufficient oxide content for use as an etch stop could be identified and deposited in the same chambers as existing low k dielectric materials. Such barrier layers would not increase the overall dielectric constant of the dielectric layers, and such an etch stop layer would not have to be removed after etching the underlying layers.

U.S. Pat. No. 5,554,570 describes barrier layers for use with thermal CVD silicon oxides wherein an organosilane having a C—H group is oxidized instead of silane to increase the density of deposited films and to improve adhesion between the layers. For example, a thermal CVD layer produced from tetraethoxysilane (TEOS) and ozone, may be deposited between PECVD silicon oxide films produced from an organosilane and $N_2O$ or $O_2$. The barrier layers described in the '570 patent are preferably dense silicon oxide layers having low carbon contents. The dense layers are deposited using 400 W of high frequency RF power although the use of low frequency RF power is asserted to improve film stress. The barrier layers are preferably produced from alkoxysilanes or chlorinated alkylsilanes and $N_2O$ to reduce carbon content and increase the density of the layers.

The '570 patent does not identify process conditions for making barrier layers having low dielectric constants or for making etch stop layers having high oxide contents. The '570 patent also does not suggest use of the described layers as a barrier layer adjacent a low k dielectric layer or as an etch stop.

There remains a need for dielectric layers having low dielectric constants, good barrier properties, and high oxide content for use as barrier layers or etch stop layers in sub-micron devices.

SUMMARY OF THE INVENTION

The present invention provides a method and apparatus for depositing a nano-porous silicon oxide layer having a low dielectric constant. The nano-porous silicon oxide layer is produced by depositing a silicon/oxygen containing material that may further contain thermally labile organic groups, and by controlled annealing of the deposited silicon/oxygen containing material to form microscopic gas pockets that are uniformly dispersed in a silicon oxide layer. The relative volume of the microscopic gas pockets to the silicon oxide layer is controlled to maintain a closed cell foam structure that provides low dielectric constants. The silicon/oxygen material is chemical vapor deposited by condensing a peroxide compound on the surface of a substrate and by contacting the deposited peroxide compound with a reactive compound or mixture containing hydrogenated silicon. When labile organic groups are in the reactive compound or mixture, the labile organic groups contain sufficient oxygen to convert to gaseous products when the deposited silicon oxide layer is annealed.

Reactive compounds or mixtures containing hydrogenated silicon that form nano-porous silicon oxide-based layers under controlled annealing include silane, methylsilane, dimethylsilane, disilanomethane, bis (methylsilano)methane, 1,3,5-trisilanacyclohexane, cyclo-1,3,5,7-tetrasilano-2,6-dioxy-4,8-dimethylene, 1,3-bis (silanomethylene)siloxane, and 1,2-disilanotetrafluoroethane, and combinations thereof. Formation of voids using 1,3,5-trisilanacyclohexane and cyclo-1,3,5,7-tetrasilano-2,6-dioxy-4,8-dimethylene is enhanced by virtue of their non-planar ring structure.

Reactive compounds or mixtures that comprise silicon and thermally labile organic groups include bis (formyloxysilano)methane, bis(glyoxylylsilano)methane, bis(formyl-carbonyldioxysilano)methane, 2,2-bis (formyloxysilano)propane, 1,2-bis(formyloxysilano)ethane, 1,2-bis(glyoxylylsilano)ethane, and mixtures thereof. Such compounds react with hydrogen peroxide to form a gel-like silicon/oxygen containing material that retains many of the labile organic groups. The amount of labile organic groups can be increased by mixing the reactive compounds with non-silicon containing components that comprise one or more labile organic groups, such as methyl maleic anhydride, 3-formyloxy-2,5-furandione, glycidaldehyde, oxiranylglyoxalate, dioxiranyl carbonate, dioxiranyl mesoxalate, and glycidic anhydride. The non-silicon containing components can alternatively be mixed with the reactive silicon containing materials that do not contain labile organic groups, such as silane, methylsilane, dimethylsilane, disilanomethane, bis(methylsilano)methane, 1,3,5-trisilanacyclohexane, cyclo-1,3,5,7-tetrasilano-2,6-dioxy-4,8-dimethylene, 1,3-bis(silanomethylene)siloxane, and 1,2-disilanotetrafluoroethane.

The deposited silicon/oxygen containing material is preferably annealed at a gradually increasing temperature profile to convert the labile organic groups to dispersed gas pockets in a nano-porous silicon oxide layer having a low dielectric constant attributed to a closed cell foam structure. Annealing preferably increases the temperature of the deposited material to about 400° C. or more.

In a preferred gap filling embodiment, the nano-porous silicon oxide layer of the present invention is deposited on a silicon oxide barrier layer that was deposited on a patterned metal layer by plasma assisted reaction of one or more reactive silicon containing compounds and nitrous oxide, preferably using low levels of constant or pulsed RF power. The nano-porous silicon oxide layer is then deposited in the same chamber in the absence of RF power. After annealing as described above, the nano-porous silicon oxide layer is optionally capped in the same chamber by further reaction of the organosilane and/or organosiloxane compound and nitrous oxide using low levels of constant or pulsed RF power. The liner and cap layers serve as barriers which protect the nano-porous silicon oxide layer.

The invention further provides an intermetal dielectric material (IMD) comprising the nano-porous silicon oxide layer which is deposited on a conventional etch stop such as silicon oxide or silicon nitride. The silicon oxide can also be deposited as a thin adhesive layer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 10A–10H are cross sectional views showing a dual damascene deposition sequence wherein the silicon oxide of the present invention is used to adhere an intermetal dielectric film to a conventional etch stop.

Figure 1A:
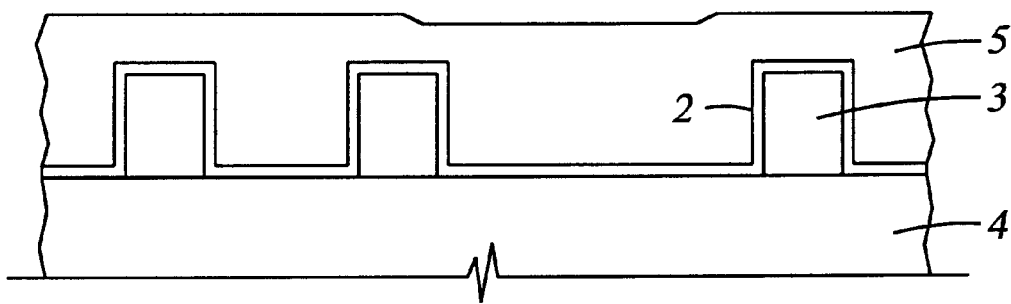
FIGS. 1A–1B (Prior Art) are schematic diagrams of dielectric layers deposited on a substrate by the processes known in the art.
Figure 1B:
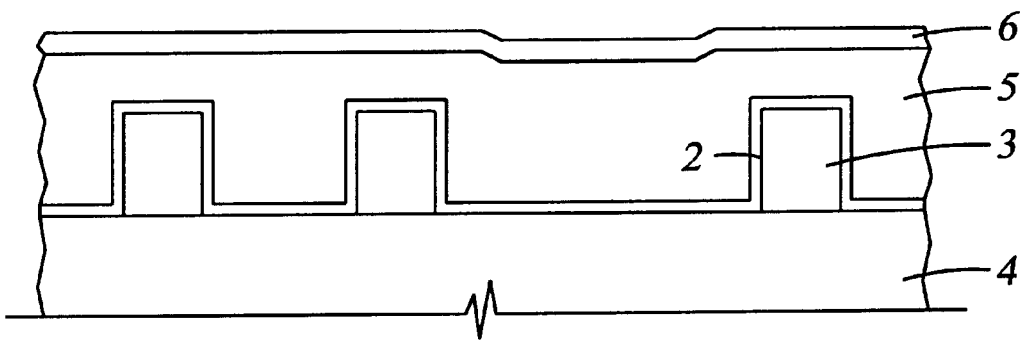

The organosilane and organosiloxane compounds generally include the structures:

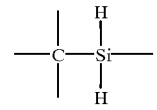

wherein each Si is bonded to at least two hydrogen atoms and may be bonded to one or two carbon atoms, and C is included in an organo group, preferably alkyl or alkenyl groups such as —CH$_3$, —CH$_2$—CH$_3$, —CH$_2$—, or —CH$_2$—CH$_2$—, or fluorinated carbon derivatives thereof. When an organosilane or organosiloxane compound includes two or more Si atoms, each Si is separated from another Si by —O—, —C—, or —C—C—, wherein each bridging C is included in an organo group, preferably alkyl or alkenyl groups such as —CH$_2$—, —CH$_2$—CH$_2$—, —CH(CH$_3$)—, —C(CH$_3$)$_2$—, or fluorinated carbon derivatives thereof. The preferred organosilane and organosiloxane compounds are gases or liquids near room temperature and can be volatilized above about 10 Torr. Preferred organosilanes and organosiloxanes include:

| | |
|---|---|
| silane, | SiH$_4$ |
| methylsilane, | CH$_3$—SiH$_3$ |
| dimethylsilane, | (CH$_3$)$_2$—SiH$_2$ |
| disilanomethane, | SiH$_3$—CH$_2$—SiH$_3$ |
| bis(methylsilano)methane, | CH$_3$—SiH$_2$—CH$_2$—SiH$_2$—CH$_3$ |
| 1,2-disilanoethane, | SiH$_3$—CH$_2$—CH$_2$—SiH$_3$ |
| 1,2-bis(methylsilano)ethane, | CH$_3$—SiH$_2$—CH$_2$—CH$_2$—SiH$_2$—CH$_3$ |
| 2,2-disilanopropane, | SiH$_3$—C(CH$_3$)$_2$—SiH$_3$ |
| cyclo-1,3,5,7-tetrasilano-2,6-dioxy-4,8-dimethylene | —(—SiH$_2$—CH$_2$—SiH$_2$—O—)$_2$— (cyclic) |
| 1,3,5-trisilanacyclohexane, | —(—SiH$_2$—CH$_2$—)$_3$— (cyclic) |
| 1,3-dimethyldisiloxane, | CH$_3$—SiH$_2$—O—SiH$_2$—CH$_3$ |
| 1,3-bis(silanomethylene)disiloxane, | (SiH$_3$—CH$_2$—SiH$_2$—)$_2$—O |
| bis(1-methyldisiloxanyl)methane, and | (CH$_3$—SiH$_2$—O—SiH$_2$—)$_2$—CH$_2$ |
| 2,2-bis(1-methyldisiloxanyl)propane, | (CH$_3$—SiH$_2$—O—SiH$_2$—)$_2$—C(CH$_3$)$_2$ |

For a further understanding of the present invention, reference should be made to the ensuing detailed description.

DESCRIPTION OF A PREFERRED EMBODIMENT

The present invention provides a method and apparatus for depositing a nano-porous silicon oxide layer having a low dielectric constant. The nano-porous silicon oxide layer is produced by depositing a silicon/oxygen containing material that optionally contains thermally labile organic groups, and by controlled annealing of the deposited silicon/oxygen containing material to form microscopic gas pockets that are uniformly dispersed in a silicon oxide layer. The relative volume of the microscopic gas pockets to the silicon oxide layer is controlled to maintain a closed cell foam structure that provides low dielectric constants and low permeability after annealing. The nano-porous silicon oxide layers will have dielectric constants less than about 3.0.

and fluorinated carbon derivatives thereof, such as 1,2-disilanotetrafluoroethane. The hydrocarbon groups in the organosilanes and organosiloxance may be partially or fully fluorinated to convert C—H bonds to C—F bonds. Many of the preferred organosilane and organosiloxane compounds are commercially available. A combination of two or more of the organosilanes or organosiloxanes can be employed to provide a blend of desired properties such as dielectric constant, oxide content, hydrophobicity, film stress, and plasma etching characteristics.

The silicon/oxygen material is chemical vapor deposited by condensing a peroxide compound such as hydrogen peroxide on the surface of a substrate, and by contacting the deposited peroxide compound with a reactive compound or mixture comprising silicon hydride groups and optional thermally labile organic groups. Formation of voids using some compounds such as 1,3,5-trisilanacyclohexane and cyclo-1,3,5,7-tetrasilano-2,6-dioxy-4,8-dimethylene is achieved during annealing without addition of labile groups by virtue of a non-planar ring structure. The thermally labile organic groups contain sufficient oxygen to form gaseous products when the silicon oxide layer is annealed. Preferred labile groups include formyloxy (CH(O)—O—), glyoxylyl (CH(O)—CO—O—), and formyl-carbonyldioxy (CH(O)—O—CO—O—).

Reactive compounds that comprise silicon hydride and thermally labile organic groups include:

| | |
|---|---|
| bis(formyloxysilano)methane, | $(CH(O)-O-SiH_2-)_2CH_2$ |
| bis(glyoxylylsilano)methane, | $(CH(O)-CO-O-SiH_2-)_2CH_2$ |
| bis(formylcarbonyldioxysilano)methane, | $(CH(O)-O-CO-O-SiH_2-)_2CH_2$ |
| 2,2-bis(formyloxysilano)propane, | $(CH(O)-O-SiH_2-)_2C(CH_3)_2$ |
| 1,2-bis(formyloxysilano)ethane, and | $(CH(O)-O-SiH_2-CH_2-)_2$ |
| 1,2-bis(glyoxylylsilano)ethane. | $(CH(O)-CO-O-SiH_2-CH_2-)_2$ |
| and fluorinated bridging carbon derivatives thereof, such as: | |
| bis(formyloxysilano)difluoromethane, and | $(CH(O)-O-SiH_2-)_2CF_2$ |
| 1,2-bis(glyoxylylsilano)tetrafluoroethane. | $(CH(O)-CO-O-SiH_2-CF_2-)_2$ |

Such compounds react with hydrogen peroxide to form a gel-like silicon/oxygen containing material that retains many of the labile organic groups at temperatures below about 40° C. The amount of labile organic groups retained in the deposited silicon/oxygen containing material can be increased by mixing the reactive compounds with non-silicon containing components that comprise one or more labile organic groups. The labile organic groups include the formyloxy ($CH(O)-O-$), glyoxylyl ($CH(O)-CO-O-$), and formylcarbonyldioxy ($CH(O)-O-CO-O-$) groups described for the silicon containing reactive compounds and other oxygen containing organic groups. Preferred non-silicon containing components include:

| | |
|---|---|
| methyl maleic anhydride, | $-(-CO-CH=C(CH_3)-CO-O-)-$ (cyclic) |
| 3-formyloxy-2,5-furandione, | $-(-CO-CH=C(O-CH(O))-CO-O-)-$ (cyclic) |
| glycidaldehyde, | 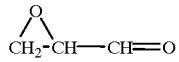 |
| oxiranylglyoxalate, | 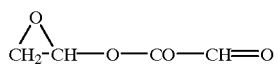 |
| dioxiranyl carbonate, | 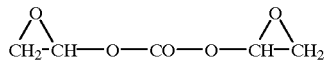 |
| dioxiranyl mesoxalate, and | 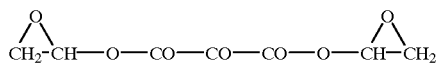 |
| glycidic anhydride. | 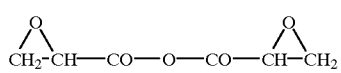 |

The non-silicon containing components can alternatively be mixed with the reactive silicon containing materials that do not contain labile organic groups, such as:

| | |
|---|---|
| silane, | SiH$_4$ |
| methylsilane, | CH$_3$—SiH$_3$ |
| dimethylsilane, | (CH$_3$)$_2$—SiH$_2$ |
| disilanomethane, | SiH$_3$—CH$_2$—SiH$_3$ |
| bis(methylsilano)methane, | CH$_3$—SiH$_2$—CH$_2$—SiH$_2$—CH$_3$ |
| 1,2-disilanoethane, | SiH$_3$—CH$_2$—CH$_2$—SiH$_3$ |
| 1,2-bis(methylsilano)ethane, | CH$_3$—SiH$_2$—CH$_2$—CH$_2$—SiH$_2$—CH$_3$ |
| 2,2-disilanopropane, | SiH$_3$—C(CH$_3$)$_2$—SiH$_3$ |
| 1,3,5-trisilanacyclohexane, | —(—SiH$_2$CH$_2$—)$_3$— (cyclic) |
| cyclo-1,3,5,7-tetrasilano-2,6-dioxy-4,8-dimethylene | —(—SiH$_2$—CH$_2$—SiH$_2$—O—)$_2$— (cyclic) |
| 1,3-dimethyldisiloxane, | CH$_3$—SiH$_2$—O—SiH$_2$—CH$_3$ |
| 1,3-bis(silanomethylene)disiloxane, | (SiH$_3$—CH$_2$—SiH$_2$—)$_2$—O |
| bis(1-methyldisiloxanyl)methane, and | (CH$_3$—SiH$_2$—O—SiH$_2$—)$_2$—CH$_2$ |
| 2,2-bis(1-methyldisiloxanyl)propane, | (CH$_3$—SiH$_2$—O—SiH$_2$—)$_2$—C(CH$_3$)$_2$ |
| and the fluorinated carbon derivatives thereof. | |

The deposited silicon/oxygen containing material is preferably annealed at a gradually increasing temperature to convert the labile organic groups to dispersed gas pockets in a nano-porous silicon oxide layer having a low dielectric constant attributed to a closed cell foam structure.

In a preferred gap filling embodiment, the nano-porous silicon oxide layer of the present invention is deposited on a silicon oxide barrier layer that was deposited on a patterned metal layer by plasma assisted reaction of one or more reactive silicon containing compounds and nitrous oxide, preferably using low levels of constant or pulsed RF power. The reactive silicon compounds are preferably silane and the other compounds listed with silane above. The nano-porous silicon oxide layer is then deposited in the same multichamber clustered CVD system in the absence of RF power, and is heated using an increasing temperature profile, optionally to about 400° C. The nano-porous silicon oxide layer is optionally capped in the same chamber used to deposit the barrier layer by further reaction of the reactive silicon compound and nitrous oxide using low levels of constant or pulsed RF power. The liner and cap layers serve as barriers which protect the nano-porous silicon oxide layer.

The liner and cap layers can be deposited by plasma assisted oxidation of the reactive silicon containing compounds. A preferred reactive silicon containing compound is dimethylsilane which is deposited using from about 10 to about 200 W of constant RF power, or from about 20 to about 200 W of pulsed RF power. Pulsed RF power can operate at higher peak power levels and provide the same total power input as non-pulsed RF power at a lower power level. Carbon which remains in the liner and cap layers contributes to low dielectric constants and barrier properties. The remaining carbon preferably includes sufficient C—H or C—F bonds to provide a hydrophobic layer that is a good moisture barrier.

The reactive silicon containing compounds are oxidized during deposition of the liner and cap layers by plasma assisted reaction with oxygen which is formed during the deposition process by decomposition of an oxygen containing compound such as nitrous oxide (N$_2$O). Nitrous oxide does not react without plasma assistance and the oxygen—nitrogen bonds are readily broken at lower energies than the bonds in the reactive silicon containing compounds. The oxidized compounds adhere to contacted surfaces such as a patterned layer of a semiconductor substrate to form a deposited film. The deposited films are cured and annealed at reduced pressure and at temperatures from about 200 to about 450° C., preferably above about 400° C. to stabilize the barrier properties of the films. The deposited film has sufficient carbon content to provide barrier properties. The carbon content preferably includes C—H or C—F bonds to provide a hydrophobic film that is an excellent moisture barrier.

The present invention further provides a substrate processing system having a plasma reactor including a reaction zone, a substrate holder for positioning a substrate in the reaction zone, and a vacuum system. The processing system further comprises a gas/liquid distribution system connecting the reaction zone of the vacuum chamber to supplies of the reactant gases and an inert gas, and an RF generator coupled to the gas distribution system for generating a plasma in the reaction zone. The processing system further comprises a controller comprising a computer for controlling the plasma reactor, the gas distribution system, and the RF generator, and a memory coupled to the controller, the memory comprising a computer usable medium comprising a computer readable program code for selecting the process steps of depositing a low dielectric constant film with a plasma of an organosilane or organosiloxane compound and an oxidizing gas.

The processing system may further comprise in one embodiment computer readable program code for selecting the process steps of depositing a liner of the oxidized organo silane compound, depositing a different dielectric layer, and optionally depositing a capping layer of the oxidized organo silane compound.

Further description of the invention will be directed toward a specific apparatus for depositing nano-porous silicon oxide layers of the present invention and toward preferred gap filling films.

Exemplary CVD Plasma Reactor

Figure 2:
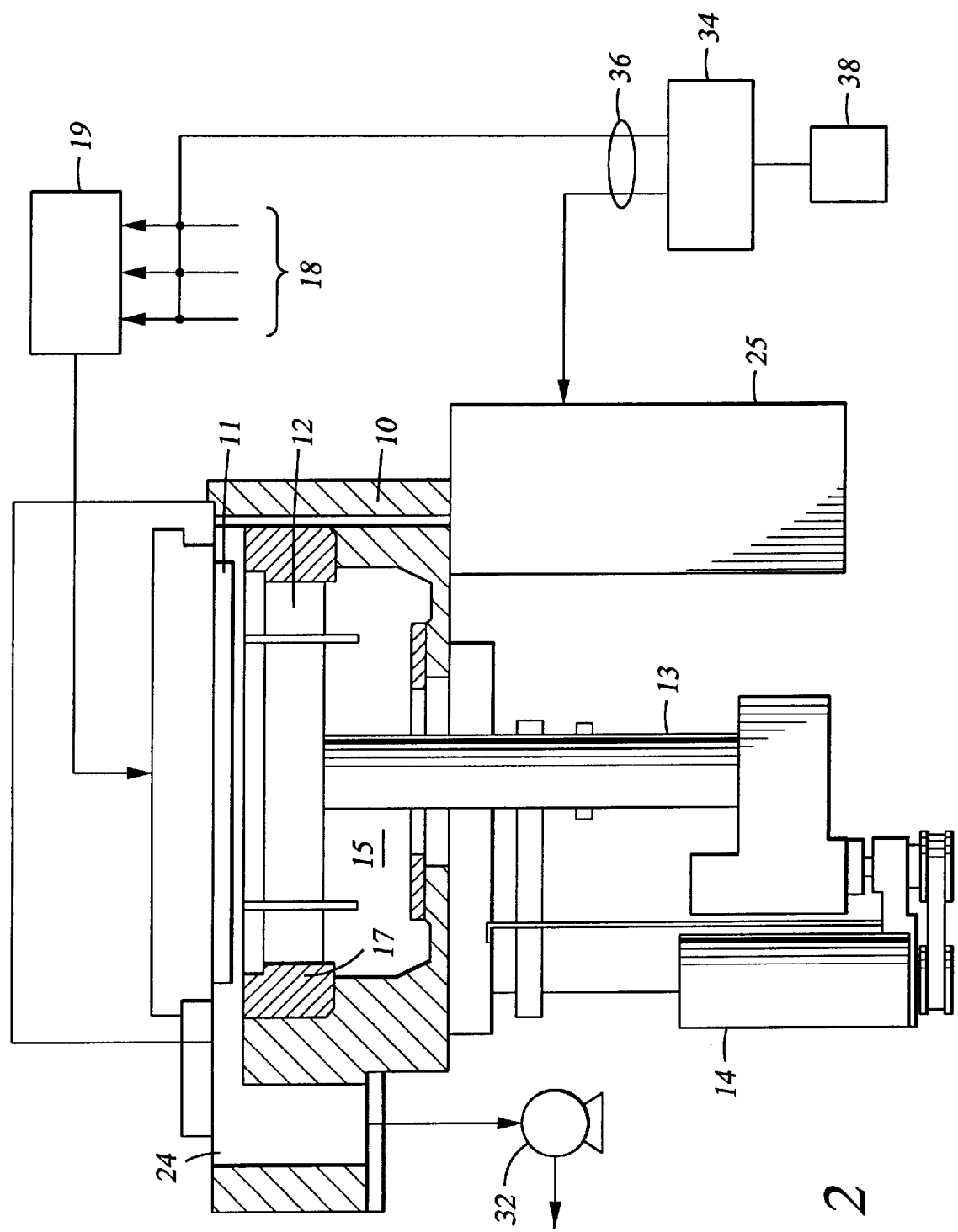
FIG. 2 is a cross-sectional diagram of an exemplary CVD reactor configured for use according to the present invention.

One suitable CVD plasma reactor in which a method of the present invention can be carried out is shown in FIG. 2, which is a vertical, cross-section view of a parallel plate chemical vapor deposition reactor 10 having a high vacuum region 15. Reactor 10 contains a gas distribution manifold 11 for dispersing process gases through perforated holes in the manifold to a substrate or wafer (not shown) that rests on a substrate support plate or susceptor 12 which is raised or lowered by a lift motor 14. A liquid injection system (not shown), such as typically used for liquid injection of TEOS, may also be provided for injecting a liquid reactant. Preferred liquid injection systems include the AMAT Gas Precision Liquid Injection System (GPLIS) and the AMAT Extended Precision Liquid Injection System (EPLIS), both available from Applied Materials, Inc.

The reactor 10 includes heating of the process gases and substrate, such as by resistive heating coils (not shown) or external lamps (not shown). Referring to FIG. 2, susceptor 12 is mounted on a support stem 13 so that susceptor 12 (and the wafer supported on the upper surface of susceptor 12) can be controllably moved between a lower loading/offloading position and an upper processing position which is closely adjacent to manifold 11.

When susceptor 12 and the wafer are in processing position 14, they are surrounded by a an insulator 17 and process gases exhaust into a manifold 24. During processing, gases inlet to manifold 11 are uniformly distributed radially across the surface of the wafer. A vacuum pump 32 having a throttle valve controls the exhaust rate of gases from the chamber.

Before reaching manifold 11, deposition and carrier gases are input through gas lines 18 into a mixing system 19 where they are combined and then sent to manifold 11. Generally, the process gases supply lines 18 for each of the process gases include (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in reactor 10 can be either a non-plasma process on a cooled substrate pedestal or a plasma enhanced process. In a plasma process, a controlled plasma is typically formed adjacent to the wafer by RF energy applied to distribution manifold 11 from RF power supply 25 (with susceptor 12 grounded). Alternatively, RF power can be provided to the susceptor 12 or RF power can be provided to different components at different frequencies. RF power supply 25 can supply either single or mixed frequency RF power to enhance the decomposition of reactive species introduced into the high vacuum region 15. A mixed frequency RF power supply typically supplies power at a high RF frequency (RF1) of 13.56 MHz to the distribution manifold 11 and at a low RF frequency (RF2) of 360 KHz to the susceptor 12. The silicon oxide layers of the present invention are most preferably produced using low levels or pulsed levels of high frequency RF power. Pulsed RF power preferably provides 13.56 MHz RF power at about 20 to about 200 W during about 10 to about 30% of the duty cycle. Non-pulsed RF power preferably provides 13.56 MHz RF power at about 10 to about 150 W as described in more detail below. Low power deposition preferably occurs at a temperature range from about −20 to about 40° C. At the preferred temperature range, the deposited film is partially polymerized during deposition and polymerization is completed during subsequent curing of the film.

Typically, any or all of the chamber lining, gas inlet manifold faceplate, support stem 13, and various other reactor hardware is made out of material such as aluminum or anodized aluminum. An example of such a CVD reactor is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al. And assigned to Applied Materials, Inc., the assignee of the present invention.

The lift motor 14 raises and lowers susceptor 12 between a processing position and a lower, wafer-loading position. The motor, the gas mixing system 19, and the RF power supply 25 are controlled by a system controller 34 over control lines 36. The reactor includes analog assemblies, such as mass flow controllers (MFCs) and standard or pulsed RF generators, that are controlled by the system controller 34 which executes system control software stored in a memory 38, which in the preferred embodiment is a hard disk drive. Motors and optical sensors are used to move and determine the position of movable mechanical assemblies such as the throttle valve of the vacuum pump 32 and motor for positioning the susceptor 12.

The system controller 34 controls all of the activities of the CVD reactor and a preferred embodiment of the controller 34 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data but and 24-bit address bus.

Figure 3:
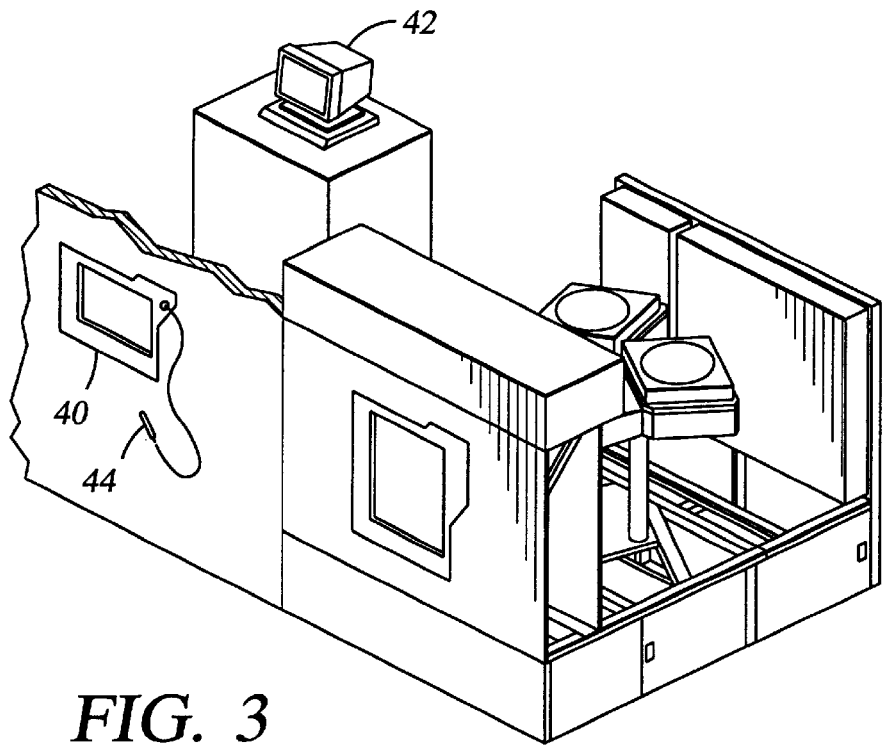
FIG. 3 is a diagram of the system monitor of the CVD reactor of FIG. 2.

The system controller 34 operates under the control of a computer program stored on the hard disk drive 38. The computer program dictates the timing, mixture of gases, RF power levels, susceptor position, and other parameters of a particular process. The interface between a user and the system controller is via a CRT monitor 40 and light pen 44 which are depicted in FIG. 3. In the preferred embodiment a second monitor 42 is used, the first monitor 40 being mounted in the clean room wall for the operators and the other monitor 42 behind the wall for the service technicians. Both monitors 40, 42 simultaneously display the same information but only one light pen 44 is enabled. The light pen 44 detects light emitted by CRT display with a light sensor in the tip of the pen. To select a particular screen or function, the operator touches a designated area of the display screen and pushes the button on the pen 44. The touched area changes its highlighted color, or a new menu or screen is displayed, confirming communication between the light pen and the display screen.

Figure 4:
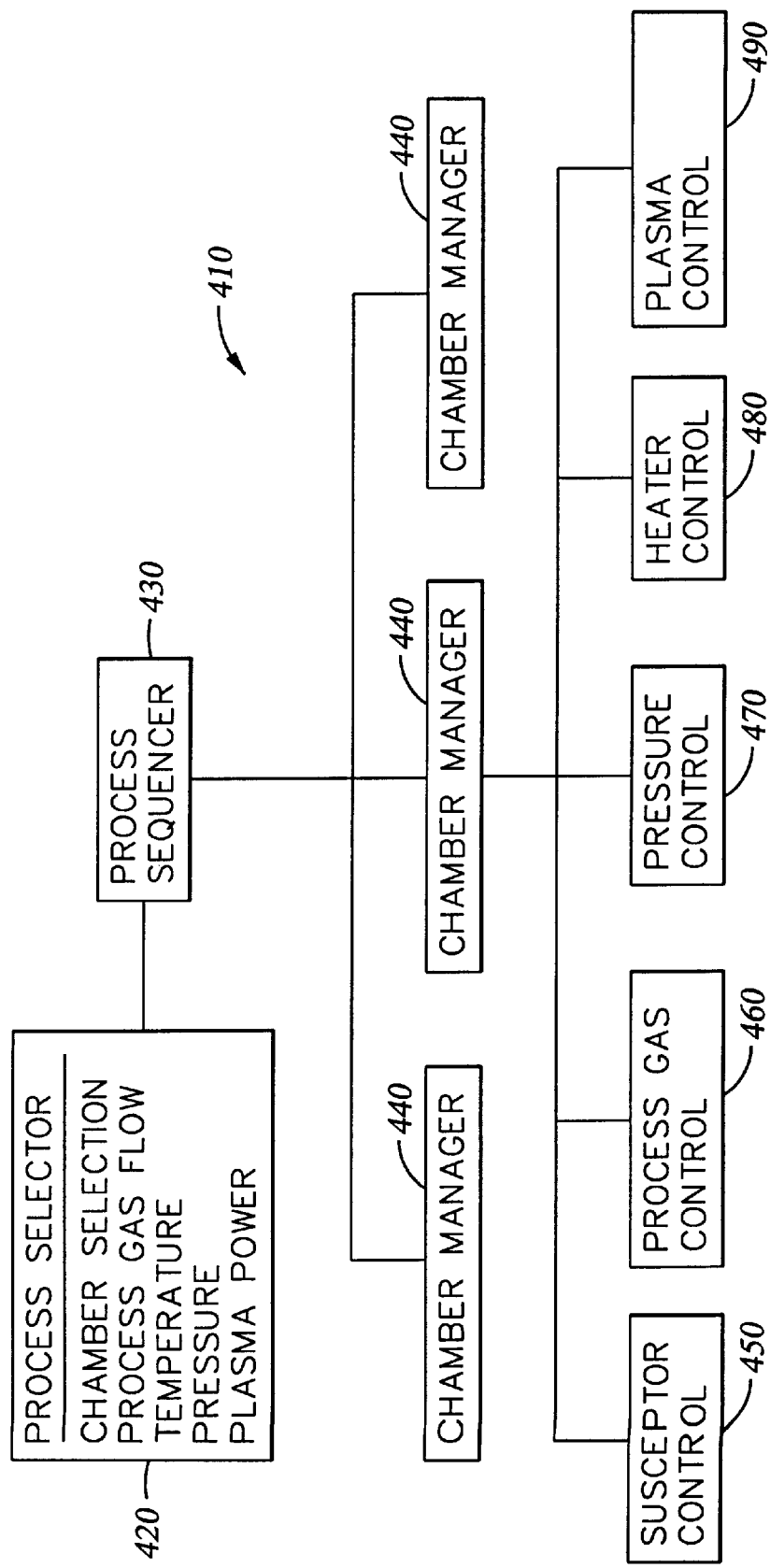
FIG. 4 is a flowchart of a process control computer program product used in conjunction with the exemplary CVD reactor of FIG. 2.

Referring to FIG. 4, the process can be implemented using a computer program product 410 that runs on, for example, the system controller 34. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 4 shows an illustrative block diagram of the hierarchical control structure of the computer program 410. A user enters a process set number and process chamber number into a process selector subroutine 420 in response to menus or screens displayed on the CRT monitor 40 by using the light pen 44 interface. The process sets are predetermined sets of process parameters necessary to carry out specified processes, and are identified by predefined set numbers. The process selector subroutine 420 the (i) selects a desired process chamber on a cluster tool such as an Centura™ platform (available from Applied Materials, Inc.), and (ii) selects a desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber 10 according to the process set determined by the sequencer subroutine 430. For example, the chamber manager subroutine 440 comprises program code for controlling CVD process operations in the process chamber 10. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in the reactor 10.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber 10 and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 4. The susceptor control positioning subroutine 450 comprises program code for controlling chamber components that are used to load the substrate onto the susceptor 12, and optionally to lift the substrate to a desired height in the reactor 10 to control the spacing between the substrate and the gas distribution manifold 11. When a substrate is loaded into the reactor 10, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 450 controls movement of the susceptor 12 in response to process set parameters that are transferred from the chamber manager subroutine 440.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, an inert gas such as helium or argon is flowed into the reactor 10 to stabilize the pressure in the chamber before reactive process gases are introduced into the chamber. For these processes, the process gas control subroutine 460 is programmed to include steps for flowing the inert gas into the chamber 10 for an amount of time necessary to stabilize the pressure in the chamber, and then the steps described above would be carried out. Additionally, when a process gas is to be vaporized from a liquid precursor, for example 1,3,5-trisilanacyclohexane, the process gas control subroutine 460 would be written to include steps for bubbling a delivery gas such as helium through the liquid precursor in a bubbler assembly. For this type of process, the process gas control subroutine 460 regulates the flow of the delivery gas, the pressure in the bubbler, and the bubbler temperature in order to obtain the desired process gas flow rates. As discussed above, the desired process gas flow rates are transferred to the process gas control subroutine 460 as process parameters. Furthermore, the process gas control subroutine 460 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 470 comprises program code for controlling the pressure in the reactor 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 470 is invoked, the desired, or target pressure level is received as a parameter from the chamber manager subroutine 440. The pressure control subroutine 470 operates to measure the pressure in the reactor 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the reactor 10 to the desired pressure.

The heater control subroutine 480 comprises program code for controlling the temperature of the heat modules or radiated heat that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the reactor 10 is not properly set up.

The plasma control subroutine 490 comprises program code for setting the RF bias voltage power level applied to the process electrodes in the reactor 10, and optionally, to set the level of the magnetic field generated in the reactor. Similar to the previously described chamber component subroutines, the plasma control subroutine 490 is invoked by the chamber manager subroutine 440.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the wafer could be supported and heated by a resistively heated susceptor. The pretreatment and method for forming a pretreated layer of the present invention is not limited to any specific apparatus or to any specific plasma excitation method.

Figure 5:
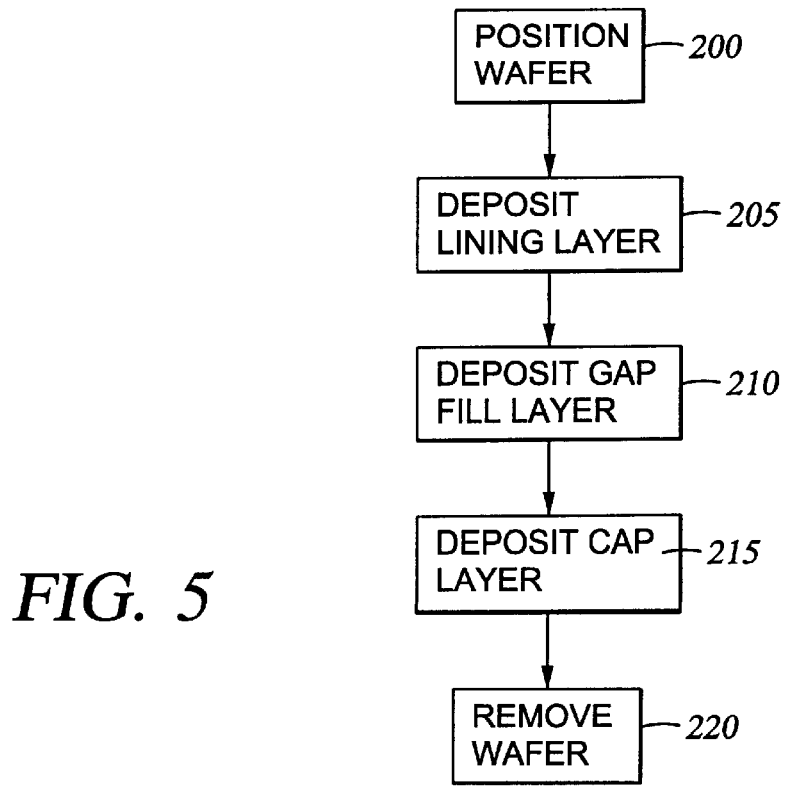
FIG. 5 is a flow chart illustrating steps undertaken in depositing liner and cap layers in a gap filling process according to one embodiment of the present invention.

Deposition of a Nano-Porous Silicon Oxide Layer in a Three-Layer Gap Filling Process The nano-porous silicon oxide layer of the present invention can be used in a threelayer gap filling process as shown in FIG. 5 using the PECVD chamber of FIG. 2. Referring to FIG. 5, a wafer is positioned 200 in the reactor 10 and a silicon oxide based layer is deposited 205 by a PECVD process from a plasma comprising a reactive silicon containing compound such as dimethylsilane. The deposition step 205 can include a capacitively coupled plasma or both an inductively and a capacitively coupled plasma in the process chamber 15 according to methods known in the art. An inert gas such as helium is commonly used in the PECVD deposition to assist in plasma generation. A nano-porous gap fill layer of the present invention is then deposited 210 on the liner layer by depositing a silicon/oxygen containing material that further contains labile organic groups, and by controlled annealing of the deposited silicon/oxygen containing material to form microscopic gas pockets that are uniformly dispersed in the gap fill layer. The gap fill layer is preferably self-planarizing by condensing the hydrogen peroxide on the surface and reacting the hydrogen peroxide with a silicon containing compound or mixture that comprises labile organic groups. A cap layer is then deposited 215 on the gap fill layer, preferably using the same process for depositing the lining layer. The wafer is then removed 220 from the reactor 10.

Referring to FIGS. 6A–6E, the three-layer gap filling process provides a PECVD lining layer 300 of the oxidized reactive silicon containing compound. The lining layer 300 acts as an isolation layer between the subsequent nano-porous gap fill layer 302 and the underlying substrate surface 304 and metal lines 306, 308, 310 formed on the substrate surface. The nano-porous gap fill layer 302 is capped by a PECVD capping layer 312 of the oxidized reactive silicon containing compound. This process is implemented and controlled using a computer program stored in the memory 38 of a computer controller 34 for a CVD reactor 10.

Figure 6A:
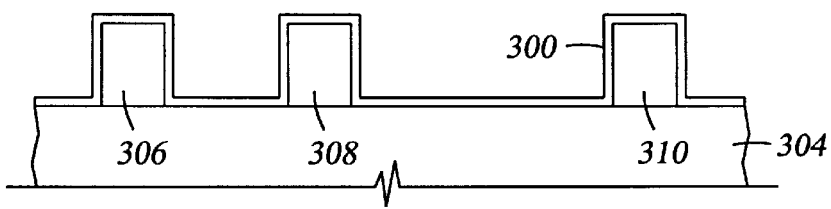
FIGS. 6A–6E is a schematic diagram of the layers deposited on a substrate by the process of FIG. 5.

Referring to FIG. 6A, the PECVD lining layer 300 is deposited in the reactor 10 by introducing a reactive silicon containing compound such as dimethylsilane ($(CH_3)_2SiH_2$), an oxidizing gas such as $N_2O$, and a carrier gas such as helium. The substrate is maintained at a temperature of from about −20 to about 400° C., and preferably is maintained at a temperature of approximately 15 to 20° C. throughout the deposition of the PECVD lining layer. The PECVD lining layer 300 is deposited with a process gas that includes a mixture of the reactive silicon containing compound at a flow rate of about 5 sccm to about 500 sccm and the oxidizing gas at a flow rate of about 5 sccm to about 2000 sccm. The process gases are carried by an inert gas such He, Ar, Ne, or a relatively inert gas such as nitrogen, which are typically not incorporated into the film, at a flow rate of from about 0.2 to about 20 lpm. The process gases react at a pressure from about 0.2 to about 20 Torr, preferably less than 10 Torr, to form a conformal silicon oxide layer on the substrate surface 304 and metal lines 306, 308, 310. The reaction is plasma enhanced with a power density ranging from 0.05 $W/Cm^2$ to 1000 $W/Cm^2$, preferably a power density less than about 1 $W/cm^2$, most preferably a power density ranging from about 0.1 to about 0.3 $W/cm^2$.

For an 8" single wafer chamber, the high frequency RF source of approximately 13.56 MHz is preferably connected to a gas distribution system and driven at about 10 to about 200 W while a low frequency RF source of about 350 KHz to MHz is optionally connected to a susceptor and driven at about 0 to about 100 W. In a preferred embodiment, the high frequency RF source is driven at about 20–200 W of pulsed RF power and the low frequency RF source is driven at about 0–50 W of pulsed RF power. When the high frequency RF power is not pulsed, the power level preferably ranges from about 10 W to about 150 W.

The oxidized liner layer is then annealed at a pressure less than the deposition pressure and a temperature from about 200 to about 450° C. Optionally, annealing could be conducted after deposition of additional dielectric layers.

Figure 6B:
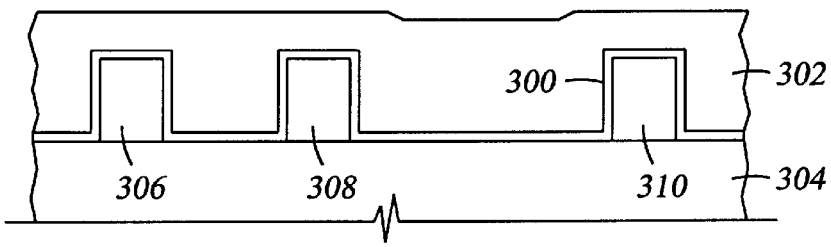

The above process conditions result in the deposition of a PECVD lining layer 300 (at about 2000 Å per minute) for the subsequent deposition of the gap filling layer 302 shown in FIG. 6B. The lining layer obtained from dimethylsilane has sufficient C—H bonds to be hydrophobic, and is an excellent moisture barier.

The process gases for the nano-porous gap filling layer 302 include one or more of the silicon containing compounds having the labile organic groups, the non-silicon containing components having the labile organic groups, and the reactive silicon containing components, and hydrogen peroxide ($H_2O_2$) which is vaporized and mixed with an inert carrier gas, such as helium.

Figure 6C:
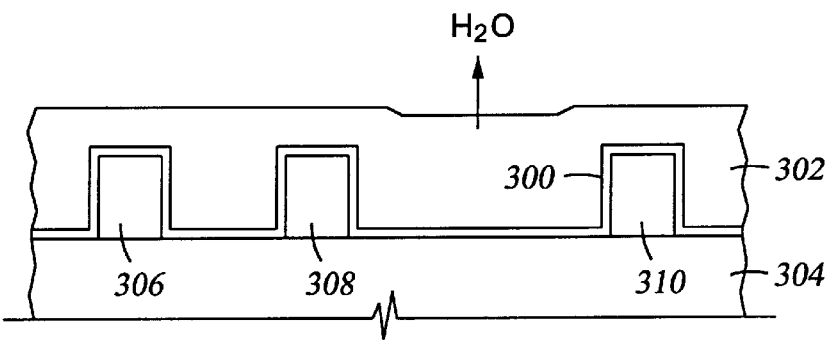
Figure 6D:
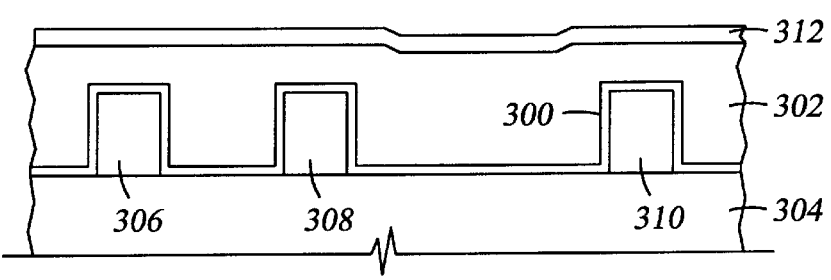

The process gas flows range from 20–1000 sccm for the silicon containing compounds, 0.1 to 3 g/min. for 50% $H_2O_2$, and 0–2000 sccm for He. The preferred gas flows range from 50–500 sccm for the silicon containing compounds having labile organic groups, 0.3 to 2 g/min. for 50% $H_2O_2$, and 100–500 sccm for He. These flow rates are given for a chamber having a volume of approximately 5.5 to 6.5 liters. Preferably, reactor 10 is maintained at a pressure of about 0.2 to about 5 torr during deposition of the gap filling layer 302. The gap filling layer 302 may be partially cured as shown in FIG. 6C to remove volatile constituents such as water prior to deposition of a cap layer 312 as shown in FIG. 6D. Curing is done in the reactor 10 by pumping under an inert gas atmosphere under 10 Torr while heating the wafer to progressively higher temperatures.

The gap filling layer is preferably annealed at a gradually increasing temperature to retain gaseous products as dispersed microscopic bubbles, and/or to convert the optional labile organic groups to dispersed microscopic gas bubbles that are retained in the cured silicon oxide film as voids in a closed cell structure. A preferred anneal process comprises a heating time period of about 10 minutes, including gradually raising the temperature by about 50° C./min. to a final temperature of about 400° C. or more. Dispersion of the gas bubbles can be controlled by varying the temperature/time profile and by controlling the concentration of labile organic groups in the deposited film.

Figure 6E:
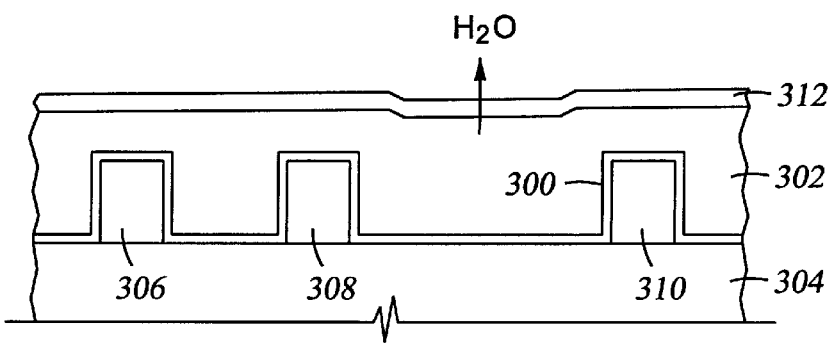

Referring to FIG. 6D, after deposition of the gap filling layer 302, the reactor 10 optionally resumes deposition of the reactive silicon containing component for deposition of a capping layer 312. Referring to FIG. 6E, after deposition of the capping layer, the deposited layers are further annealed in a furnace or another chamber at a temperature from about 200 to about 450° C. to drive off remaining volatile products such as water. Of course, processing conditions will vary according to the desired characteristics of the deposited films.

Deposition of a Dual Damascene Structure

Figure 7:
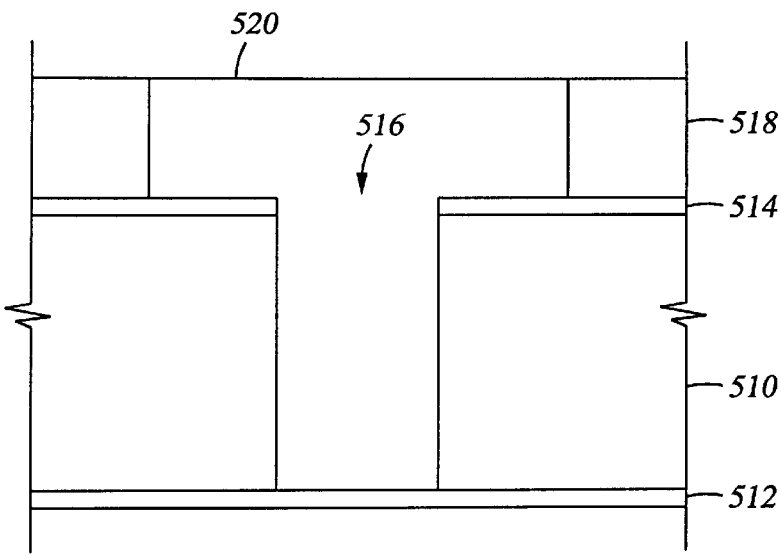
FIG. 7 is a cross sectional view showing a dual damascene structure comprising the silicon oxide layers of the present invention.

A dual damascene structure which includes a nano-porous intermetal dielectric layer is shown in FIG. 7. A first dielectric layer 510, preferably consisting of the nano-porous silicon oxide layer of the present invention is deposited on a substrate 512 and then a conventional silicon oxide, silicon nitride, or hydrogenated silicon carbide etch stop 514 is deposited on the first dielectric layer. The etch stop is then patterned to define the openings of the contacts/vias 516. A second nano-porous dielectric layer 518 is then deposited over the patterned etch stop and then patterned to define the interconnect lines 520. A single etch process is then performed to define the interconnects down to the etch stop and to etch the unprotected dielectric exposed by the patterned etch stop to define the contacts/vias.

Figure 8A:
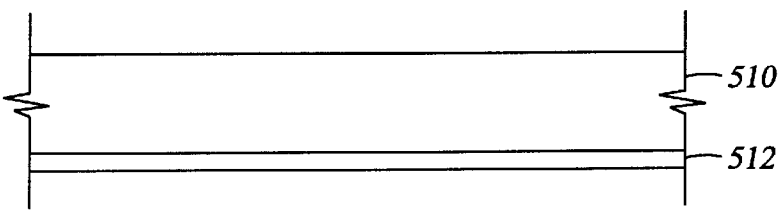
FIGS. 8A–8H are cross sectional views showing one embodiment of a dual damascene deposition sequence of the present invention.
Figure 8B:
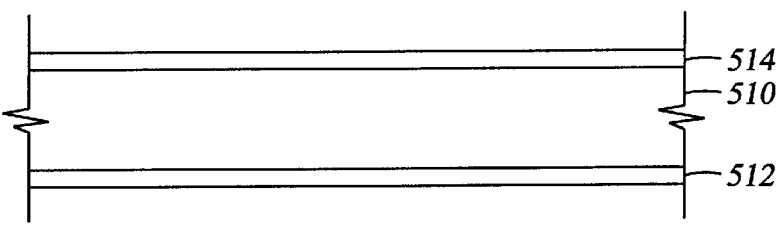
Figure 8C:
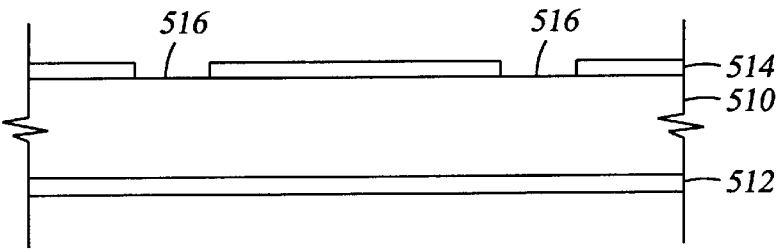
Figure 8D:
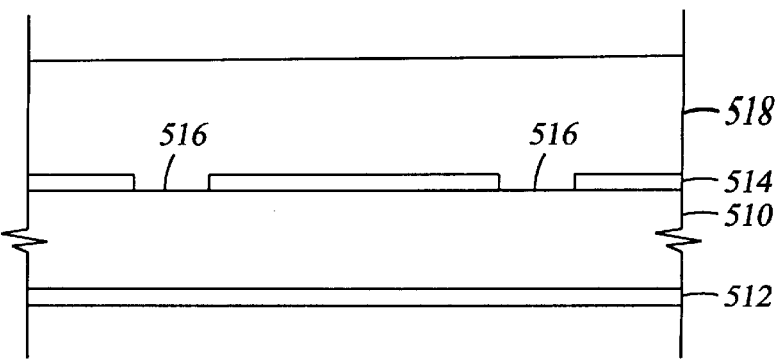
Figure 8E:
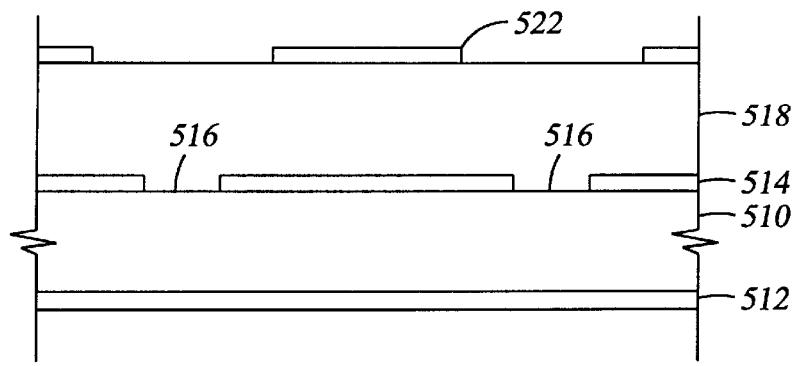
Figure 8F:
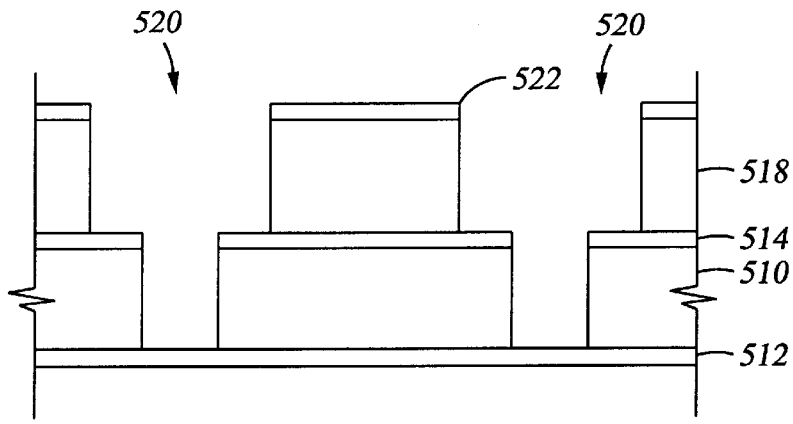
Figure 8G:
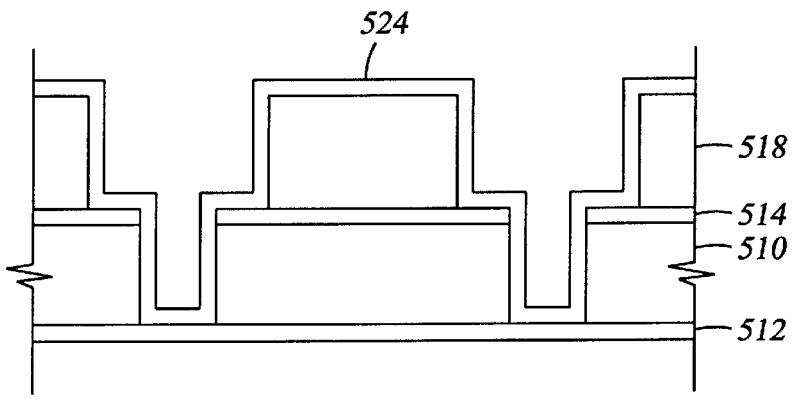
Figure 8H:
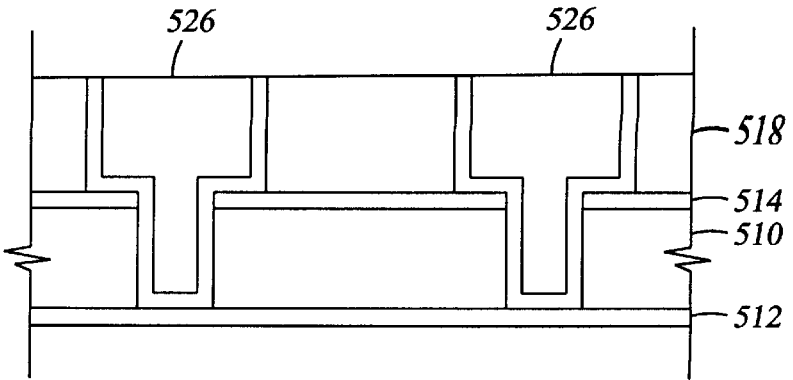

A preferred dual damascene structure fabricated in accordance with the invention includes a lining layer as shown in FIG. 8H, and the method of making the structure is sequentially depicted schematically in FIGS. 8A–8H, which are cross sectional views of a substrate having the steps of the invention formed thereon.

As shown in FIG. 8A, an initial first nano-porous dielectric layer 510 is deposited on the substrate 512 to a thickness of about 5,000 to about 10,000 Å, depending on the size of the structure to be fabricated, and is then annealed. As shown in FIG. 8B, a low k etch stop 514, which is an oxidized dimethysilane layer as described above for the three layer gap fill, is then deposited on the first nano-porous dielectric layer to a thickness of about 200 to about 1000 Å using low levels of RF power. The low k etch stop 514 is then pattern etched to define the contact/via openings 516 and to expose the first nano-porous dielectric layer 510 in the areas where the contacts/vias are to be formed as shown in FIG. 8C. Preferably, low k etch stop 514 is pattern etched using conventional photolithography and etch processes using fluorine, carbon, and oxygen ions. After low k etch stop 514 has been etched to pattern the contacts/vias and the photo resist has been removed, a second nano-porous dielectric layer 518 is deposited over etch stop 514 to a thickness of about 5,000 to about 10,000 Å as shown in FIG. 8D, and is then annealed. The second nano-porous dielectric layer 518 is then patterned to define interconnect lines 520, preferably using conventional photolithography processes with a photo resist layer 522 as shown in FIG. 8E. The interconnects and contacts/vias are then etched using reactive ion etching or other anisotropic etching techniques to define the metallization structure (i.e., the interconnect and contact/via) as shown in FIG. 8F. Any photo resist or other material used to pattern the etch stop 514 or the second dielectric layer 518 is removed using an oxygen strip or other suitable process.

The metallization structure is then formed with a conductive material such as aluminum, copper, tungsten or combinations thereof. Presently, the trend is to use copper to form the smaller features due to the low resistivity of copper (1.7 μΩ-cm compared to 3.1 μΩ-cm for aluminum). Preferably, as shown in FIG. 8G, a suitable barrier layer 524 such as tantalum nitride is first deposited conformally in the metallization pattern to prevent copper migration into the surrounding silicon and/or dielectric material. Thereafter, copper 526 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 8H.

Deposition of Adhesive Layers

Figure 9:
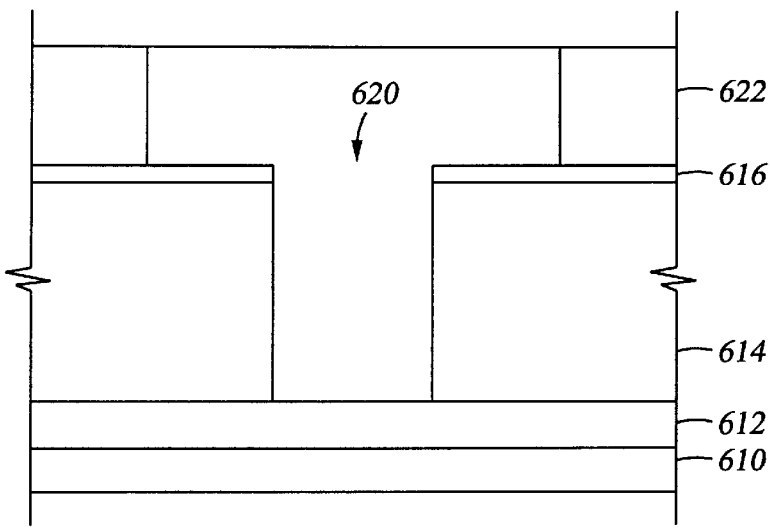
FIG. 9 is a cross sectional view showing an adhesive layer comprising the silicon oxide layer of the present invention between a premetal dielectric layer and an intermetal dielectric layer.

A dual damascene structure which includes an oxidized dimethysilane layer as an adhesive layer between a premetal dielectric layer and an intermetal nano-porous dielectric layer is shown in FIG. 9. The oxidized dimethylsilane layer 612 is deposited on a premetal dielectric layer 610 such as a conventional PSG or BPSG layer and then annealed. A nano-porous intermetal dielectric layer 614, as described herein, is then deposited over the adhesive layer 612. A conventional silicon oxide or silicon nitride etch stop 616 is deposited and then patterned by conventional methods to define vias 620. A second nano-porous intermetal dielectric layer 622 is then deposited over the patterned etch stop and then patterned to define the interconnect lines. A single etch process is then performed to define the interconnects down to the etch stop and to etch the unprotected dielectric exposed by the patterned etch stop to define the contacts/vias prior to metallization.

Figure 10A:
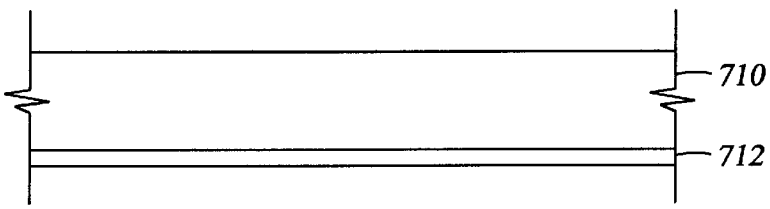

A preferred dual damascene structure comprising a nano-porous dielectric layer in accordance with the invention is shown in FIG. 10H, and the method of making the structure is sequentially depicted schematically in FIGS. 10A–10H, which are cross sectional views of a substrate having the steps of the invention formed thereon.

Figure 10B:
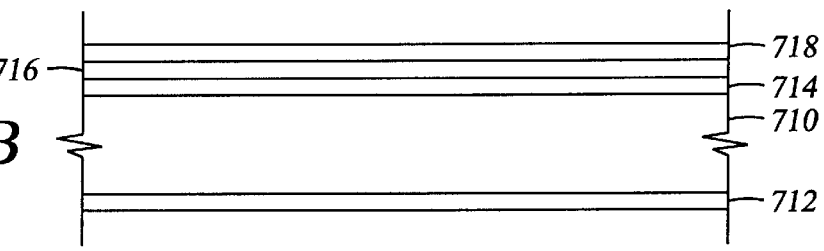
Figure 10C:
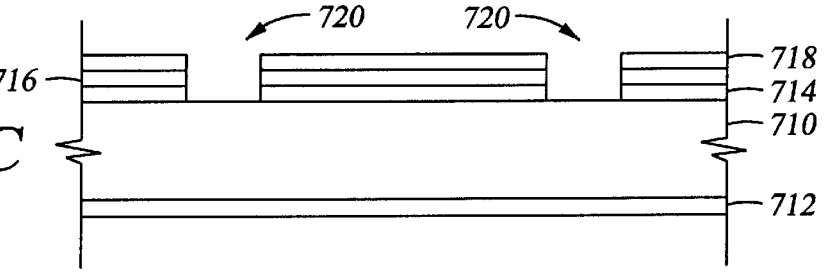
Figure 10D:
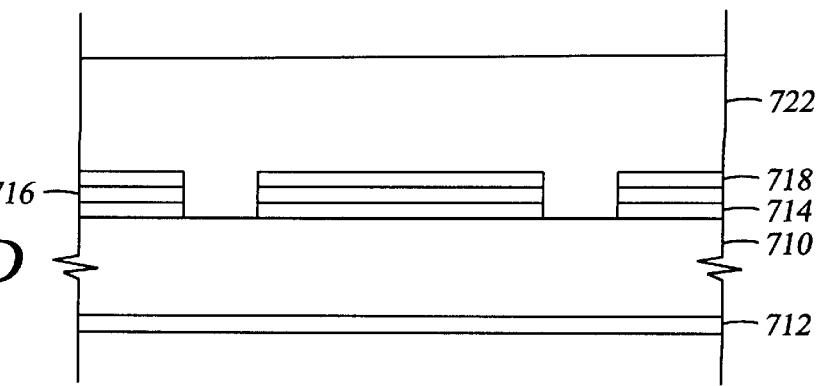

As shown in FIG. 10A, a first nano-porous intermetal dielectric layer 710 is deposited on a substrate 712 to a thickness of about 5,000 to about 10,000 Å, depending on the size of the structure to be fabricated. As shown in FIG. 10B, a low k adhesive layer 714, which is preferably the oxidized dimethylsilane layer, is then deposited on the first nano-porous intermetal dielectric layer 710 to a thickness of about 50 to about 200 Å. A conventional silicon oxide or silicon nitride etch stop 716 is the deposited on the adhesive layer 714 to a thickness of about 50 to about 200 Å. A second low k adhesive layer 718, which is preferably the oxidized dimethylsilane layer, is then deposited on the etch stop 716 to a thickness of about 50 to about 200 Å. The etch stop 716 and adhesive layers 714, 718 are then pattern etched to define the contact/via openings 720 and to expose first nano-porous intermetal dielectric layer 710 in the areas where the contacts/vias are to be formed as shown in FIG. 10C. Preferably, the etch stop 716 is pattern etched using conventional photolithography and etch processes using fluorine, carbon, and oxygen ions. After the etch stop 716 and adhesive layers 714, 718 have been etched to pattern the contacts/vias and the photo resist has been removed, a second nano-porous intermetal dielectric layer 722 is deposited over second adhesive layer 718 to a thickness of about 5,000 to about 10,000 Å as shown in FIG. 10D. The second nano-porous intermetal dielectric layer 722 is then patterned to define interconnect lines 724, preferably using conventional photolithography processes with a photo resist layer 726 as shown in FIG. 10E. The interconnects and contacts/vias are then etched using reactive ion etching or other anisotropic etching techniques to define the metallization structure (i.e., the interconnect and contact/via) as shown in FIG. 10F. Any photo resist or other material used to pattern the etch stop 716 or the second nano-porous intermetal dielectric layer 722 is removed using an oxygen strip or other suitable process.

The metallization structure is then formed with a conductive material such as aluminum, copper, tungsten or combinations thereof. Presently, the trend is to use copper to form the smaller features due to the low resistivity of copper (1.7 $\mu\Omega$-cm compared to 3.1 $\mu\Omega$-cm for aluminum). Preferably, as shown in FIG. 10G, a suitable barrier layer 728 such as tantalum nitride is first deposited conformally in the metallization pattern to prevent copper migration into the surrounding silicon and/or dielectric material. Thereafter, copper is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 10H.

The invention is further described by the following examples of deposited nano-porous silicon oxide based films.

EXAMPLES

The following examples demonstrate deposition of a nano-porous silicon oxide based film having dispersed microscopic gas voids. This example is undertaken using a chemical vapor deposition chamber, and in particular, a CENTURA "DLK" system fabricated and sold by Applied Materials, Inc., Santa Clara, Calif.

Reactive Silicon Compounds Having Silicon Hydride Groups (Hypothetical)

A nano-porous silicon oxide based film is deposited at a chamber pressure of 1.0 Torr and temperature of 0° C. from reactive gases which are vaporized and flown into the reactor as follows:

| | |
|---|---|
| 1,3,5-trisilanacyclohexane, at | 125 sccm |
| Hydrogen Peroxide (50%), at | 1000 sccm |
| Helium, He, at | 200 sccm. |

The substrate is positioned 600 mil from the gas distribution showerhead and the reactive gases are introduced for 2 minutes. The substrate is then heated over a time period of 10 minutes, raising the temperature of the substrate by 50° C./min to a temperature of 400° C. to cure and anneal the nano-porous silicon oxide based film.

Reactive Silicon Compounds Having Thermally Labile Organic Groups (Hypothetical)

A nano-porous silicon oxide based film is deposited at a chamber pressure of 1.0 Torr and temperature of 0° C. from reactive gases which are vaporized and flown into the reactor as follows:

| | |
|---|---|
| Bis(formyloxysilano)methane, at | 150 sccm |
| Hydrogen Peroxide (50%), at | 1000 sccm |
| Helium, He, at | 200 sccm. |

The substrate is positioned 600 mil from the gas distribution showerhead and the reactive gases are introduced for 2 minutes. The substrate is then heated over a time period of 10 minutes, raising the temperature of the substrate by 50° C./min to a temperature of 400° C. to cure and anneal the nano-porous silicon oxide based film.

Reactive Silicon Compounds Having Thermally Labile Organic Groups (Hypothetical)

A nano-porous silicon oxide based film is deposited at a chamber pressure of 1.0 Torr and temperature of 0° C. from reactive gases which are vaporized and flown into the reactor as follows:

| | |
|---|---|
| Bis(glyoxylylsilano)methane, at | 150 sccm |
| Hydrogen Peroxide (50%), at | 1000 sccm |
| Helium, He, at | 200 sccm. |

The substrate is positioned 600 mil from the gas distribution showerhead and the reactive gases are introduced for 2 minutes. The substrate is then heated over a time period of 10 minutes, raising the temperature of the substrate by 50° C./min to a temperature of 400° C. to cure and anneal the nano-porous silicon oxide based film.

Reactive Silicon Containing Components And Added Thermally Labile Organic Groups (Hypothetical)

A nano-porous silicon oxide based film is deposited at a chamber pressure of 1.0 Torr and temperature of 0° C. from reactive gases which are vaporized and flown into the reactor as follows:

| | |
|---|---|
| Bis(methylsilano)methane, at | 100 sccm |
| Glycidaldehyde, at | 50 sccm |
| Hydrogen Peroxide (50%), at | 1000 sccm |
| Helium, He, at | 200 sccm. |

The substrate is positioned 600 mil from the gas distribution showerhead and the reactive gases are introduced for 2 minutes. The substrate is then heated over a time period of 10 minutes, raising the temperature of the substrate by 50° C./min to a temperature of 400° C. to cure and anneal the nano-porous silicon oxide based film.

Reactive Silicon Containing Components And Added Thermally Labile Organic Groups (Hypothetical)

A nano-porous silicon oxide based film is deposited at a chamber pressure of 1.0 Torr and temperature of 0° C. from reactive gases which are vaporized and flown into the reactor as follows:

| | |
|---|---|
| 1,3,5-trisilanacyclohexane, at | 100 sccm |
| Methyl Maleic Anhydride, at | 50 sccm |
| Hydrogen Peroxide (50%), at | 1000 sccm |
| Helium, He, at | 200 sccm. |

The substrate is positioned 600 mil from the gas distribution showerhead and the reactive gases are introduced for 3 minutes. The substrate is then heated over a time period of 10 minutes, raising the temperature of the substrate by 50° C./min to a temperature of 400° C. to cure and anneal the nano-porous silicon oxide based film.

While the foregoing is directed to preferred embodiments of the present invention, other and further embodiments of the invention may be devised without departing from the basic scope thereof, and the scope thereof is determined by the claims which follow.

What is claimed is:

1. A method for depositing a low dielectric constant film, comprising:

depositing a peroxide compound on a surface of a substrate;

reacting the deposited peroxide compound with a compound or mixture comprising thermally labile groups; and annealing the substrate to form a silicon oxide based film; whereby dispersed voids are formed in the silicon oxide based film.

2. The method of claim 1, wherein the compound or mixture comprising thermally labile groups comprises formyloxy (CH(O)—O—), glyoxylyl (CH(O)—CO—O—), or formylcarbonyldioxy (CH(O)—O—CO—O—) groups.

3. The method of claim 2, wherein the compound or mixture comprising thermally labile groups comprises a compound selected from a group of bis(formyloxysilano) methane, bis(glyoxylylsilano)methane, bis(formylcarbonyldioxysilano)methane, 2,2-bis(formyloxysilano)propane, 1,2-bis(formyloxysilano)ethane, 1,2-bis(glyoxylylsilano)ethane, fluorinated bridging carbon derivatives thereof, and combinations thereof.

4. The method of claim 3, wherein the compound or mixture comprising thermally labile groups further comprises a non-silicon component selected from a group of methyl maleic anhydride, 3-formyloxy-2,5-furandione, glycidaldehyde, oxiranylglyoxalate, dioxiranyl carbonate, dioxiranyl mesoxalate, and glycidic anhydride.

5. The method of claim 1, wherein the compound or mixture comprising thermally labile groups comprises:

a silicon compound selected from a group consisting of silane, methylsilane, dimethylsilane, disilanomethane, bis(methylsilano)methane, 1,2-disilanoethane, 1,2-bis(methylsilano)ethane, 2,2-disilanopropane, 1,3,5-trisilanacyclohexane, cyclo-1,3,5,7-tetrasilano-2,6-dioxy-4,8-dimethylene, 1,3-dimethyl-disiloxane, 1,3-bis(silanomethylene)-disiloxane, bis(1-methyldisiloxanyl)methane, and 2,2-bis(1-methyldisiloxanyl)propane, and fluorinated carbon derivatives thereof; and a non-silicon component selected from a group consisting of methyl maleic anhydride, 3-formyloxy-2,5-furandione, glycidaldehyde, oxiranylglyoxalate, dioxiranyl carbonate, dioxiranyl mesoxalate, and glycidic anhydride.

6. The method of claim 1, wherein the compound or mixture comprising thermally labile groups comprises 1,3,5-trisilanacyclohexane, cyclo- 1,3,5,7-tetrasilano-2,6-dioxy-4,8-dimethylene, bis(formyloxysilano)methane, or bis(glyoxylylsilano)methane, or fluorinated bridging carbon derivatives thereof.

7. The method of claim 1, wherein the dispersed voids are formed by annealing the substrate with a temperature profile comprising a gradual rise to a final temperature of at least 400° C.

8. The method of claim 1, wherein the compound or mixture comprising thermally labile groups has a non-planar ring structure.

9. A process for depositing a low dielectric constant film on a patterned metal layer on a substrate, comprising:

depositing a conformal lining layer on the patterned metal layer from process gases comprising one or more reactive silicon containing compounds;

depositing a peroxide compound on the conformal lining layer;

reacting the deposited peroxide compound with a compound or mixture having one or more thermally labile groups containing oxygen; and annealing the substrate to form a silicon oxide based film; whereby dispersed voids are formed in the silicon oxide based film.

10. The process of claim 9, wherein the compound or mixture having one or more thermally labile groups containing oxygen is selected from a group of bis (formyloxysilano)methane, bis(glyoxylyl-silano)methane, bis(formylcarbonyldioxysilano)methane, 2,2-bis(formyloxysilano)propane, 1,2-bis(formyloxysilano)ethane, and 1,2-bis(glyoxylylsilano)ethane, fluorinated bridging carbon derivatives thereof, and combinations thereof.

11. The process of claim 9, wherein the having one or more thermally labile groups containing oxygen further comprises a non-silicon component selected from a group of methyl maleic anhydride, 3-formyloxy-2,5-furandione, glycidaldehyde, oxiranyl-glyoxalate, dioxiranyl carbonate, dioxiranyl mesoxalate, and glycidic anhydride.

12. The process of claim 9, wherein the compound or mixture having one or more thermally labile groups containing oxygen comprises:

a compound selected from a group of silane, methylsilane, dimethylsilane, disilanomethane, bis(methylsilano) methane, 1,2-disilanoethane, 1,2-bis(methylsilano) ethane, 2,2-disilanopropane, 1,3,5-trisilanacyclohexane, cyclo- 1,3,5,7-tetrasilano-2,6-dioxy-4,8-dimethylene, 1,3-dimethyldisiloxane, 1,3-bis(silanomethylene)-disiloxane, bis(1-methyldisiloxanyl)methane, and 2,2-bis(1-methyldisiloxanyl)propane, and fluorinated carbon derivatives thereof, and a non-silicon component selected from a group of methyl maleic anhydride, 3-formyloxy-2,5-furandione, glycidaldehyde, oxiranylglyoxalate, dioxiranyl carbonate, dioxiranyl mesoxalate, and glycidic anhydride.

13. The process of claim 9, further comprising depositing a capping layer on the silicon oxide based film from process gases comprising the one or more reactive silicon containing compounds.

14. The process of claim 9, wherein the compound or mixture having one or more thermally labile groups containing oxygen comprises 1,3,5-trisilanacyclohexane, cyclo-1,3,5,7-tetrasilane-2,6-dioxy-4,8-dimethylene, bis(formyloxysilano)-methane, bis(glyoxylylsilano)methane, or fluorinated bridging carbon derivatives thereof.

15. The process of claim 9, wherein the dispersed voids are formed by annealing the substrate using a temperature profile that gradually rises to a final temperature of at least 400° C.

16. The process of claim 9, wherein the compound or mixture having one or more thermally labile groups containing oxygen has a non-planar ring structure.

17. A method of forming a dual damascene structure, comprising:

depositing a peroxide compound on a surface of a substrate;

reacting the deposited peroxide compound with a compound or mixture comprising thermally labile groups; and annealing the substrate to form a first silicon oxide based film, whereby dispersed voids are formed in the first silicon oxide based film;

depositing a low k etch stop on the first silicon oxide based film;

etching the low k etch stop to define a vertical interconnect opening that exposes the first silicon oxide based film;

depositing the peroxide compound on the low k etch stop and the exposed first silicon oxide based film;

reacting the deposited peroxide compound with the compound or mixture comprising thermally labile groups; and annealing the substrate to form a second silicon oxide based film, whereby dispersed voids are formed in the second silicon oxide based film;

etching the second silicon oxide based film to define a horizontal interconnect that exposes the vertical interconnect opening in the low k etch stop; and etching the first silicon oxide based film through the vertical interconnect opening to define a vertical interconnect.

18. The method of claim 17, wherein the first and the second silicon oxide based films comprise dispersed microscopic voids formed by annealing the substrate using a temperature profile that gradually rises to a final temperature of at least 400° C.

19. The method of claim 17, wherein the first and the second silicon oxide based films comprise dispersed microscopic voids formed by reacting a deposited peroxide compound with a silicon hydride containing compound or mixture, wherein the silicon hydride containing compound or mixture has a non-planar ring structure.

20. The method of claim 1, wherein the compound or mixture having thermally labile groups comprises one or more silicon-hydrogen bonds.

21. The method of claim 1, further comprising depositing a conformal lining layer on the substrate prior to depositing the peroxide compound on the surface of the substrate.

22. The method of claim 1, wherein the thermally labile groups comprise oxygen.

23. The method of claim 9, wherein the compound or mixture having thermally labile groups that comprise oxygen further comprise one or more silicon-hydrogen bonds.

24. A method for depositing a low dielectric constant film, comprising:

depositing a peroxide compound on a surface of a substrate;

reacting the deposited peroxide compound with a silicon hydride containing compound or mixture, wherein the silicon hydride containing compound or mixture comprises formyloxy (CH(O)—O—), glyoxylyl (CH(O)—CO—O—), or formylcarbonyldioxy (CH(O)—O—CO—O—) groups; and annealing the substrate to form a silicon oxide based film; whereby dispersed voids are formed in the silicon oxide based film.

25. The method of claim 24, wherein the silicon hydride containing compound or mixture comprises a compound selected from a group of bis(formyloxysilano)methane, bis(glyoxylylsilano)methane, bis(formylcarbonyldioxysilano)methane, 2,2-bis(formyloxysilano)propane, 1,2-bis(fornyloxysilano)ethane, 1,2-bis(glyoxylylsilano)ethane, fluorinated bridging carbon derivatives thereof, and combinations thereof.

26. The method of claim 15, wherein the silicon hydride containing compound or mixture further comprises a non-silicon component selected from a group consisting of methyl maleic anhydride, 3-formyloxy-2,5-furandione, glycidaldehyde, oxiranylglyoxalate, dioxiranyl carbonate, dioxiranyl mesoxalate, and glycidic anhydride.

27. The method of claim 24, wherein the silicon hydride containing compound or mixture further comprises a non-silicon component selected from a group consisting of methyl maleic anhydride, 3-formyloxy-2,5-furandione, glycidaldehyde, oxiranylglyoxalate, dioxiranyl carbonate, dioxiranyl mesoxalate, and glycidic anhydride.

28. The method of claim 24, wherein the dispersed voids are formed by annealing the substrate with a temperature profile comprising a gradual rise to a final temperature of at least 400° C.

29. The method of claim 24, wherein the silicon hydride containing compound or mixture has a non-planar ring structure.

30. The method of claim 25, further comprising depositing a conformal lining layer on a patterned metal layer on a substrate from process gases comprising one or more reactive silicon containing compounds and an oxidizing gas.

31. The method of claim 27, further comprising depositing a conformal lining layer on a patterned metal layer on a substrate from process gases comprising one or more reactive silicon containing compounds and an oxidizing gas.

32. The method of claim 31, further comprising depositing a capping layer on the silicon oxide based film.

33. A method for depositing a low dielectric constant film, comprising:

depositing a peroxide compound on a surface of a substrate;

reacting the deposited peroxide compound with a silicon hydride containing compound or mixture, wherein the silicon hydride containing compound or mixture comprises:

a silicon compound selected from a group consisting of silane, methylsilane, dimethylsilane, disilanomethane, bis(methylsilano)methane, 1,2-disilanoethane, 1,2-bis(methylsilano)ethane, 2,2-disilanopropane, 1,3,5-trisilanacyclohexane, cyclo-1,3,5,7-tetrasilano-2,6-dioxy-4,8-dimethylene, 1,3-dimethyl-disiloxane, 1,3-bis(silanomethylene)-disiloxane, bis(1-methyldisiloxanyl)methane, and 2,2-bis(1-methyldisiloxanyl)propane, and fluorinated carbon derivatives thereof; and a non-silicon component selected from a group consisting of methyl maleic anhydride, 3-formyloxy-2,5-furandione, glycidaldehyde, oxiranylglyoxalate, dioxiranyl carbonate, dioxiranyl mesoxalate, and glycidic anhydride annealing the substrate to form a silicon oxide based film;

whereby dispersed voids are formed in the silicon oxide based film.

34. The method of claim 33, wherein the dispersed voids are formed by annealing the substrate with a temperature profile comprising a gradual rise to a final temperature of at least 400° C.

35. The method of claim 33, wherein the silicon hydride containing compound or mixture has a non-planar ring structure.

36. The method of claim 33, further comprising depositing a conformal lining layer on a patterned metal layer on a substrate from process gases comprising one or more reactive silicon containing compounds and an oxidizing gas.

37. The process of claim 36, further comprising depositing a capping layer on the silicon oxide based film.

38. A method for depositing a low dielectric constant film, comprising:

depositing a peroxide compound on a surface of a substrate;

reacting the deposited peroxide compound with a silicon hydride containing compound or mixture, wherein the silicon hydride containing compound or mixture comprises 1,3,5-trisilanacyclohexane, cyclo-1,3,5,7-tetrasilano-2,6-dioxy-4,8-dimethylene, bis(formyloxysilano)-methane, or bis(glyoxylylsilano)methane, or fluorinated bridging carbon derivatives thereof; and annealing the substrate to form a silicon oxide based film;

whereby dispersed voids are formed in the silicon oxide based film.

39. The method of claim 38, wherein the dispersed voids are formed by annealing the substrate with a temperature profile comprising a gradual rise to a final temperature of at least 400° C.

40. The method of claim 38, wherein the silicon hydride containing compound or mixture has a non-planar ring structure.

41. The method of claim 38, further comprising depositing a conformal lining layer on a patterned metal layer on a substrate from process gases comprising one or more reactive silicon containing compounds and an oxidizing gas.

42. The process of claim 41, further comprising depositing a capping layer on the silicon oxide based film.

43. The method of claim 1, wherein the compound or mixture comprising thermally labile groups comprises formyloxy (CH(O)—O—), glyoxylyl (CH(O)—CO—O—), or formylcarbonyldioxy (CH(O)—O—CO—O—) groups.

* * * * *

UNITED STATES PATENT AND TRADEMARK OFFICE
CERTIFICATE OF CORRECTION

PATENT NO.    : 6,171,945 B1
DATED         : January 9, 2001
INVENTOR(S)   : Mandal et al.

It is certified that error appears in the above-identified patent and that said Letters Patent is hereby corrected as shown below:

<u>Title page,</u>
Item [56] other publications section, please replace "Polysilxanen" with "Polysiloxanen".

Signed and Sealed this

Fourth Day of September, 2001

*Attest:*

NICHOLAS P. GODICI
*Attesting Officer*   *Acting Director of the United States Patent and Trademark Office*